(12) United States Patent
Clark et al.

(10) Patent No.: US 6,291,875 B1
(45) Date of Patent: Sep. 18, 2001

(54) MICROFABRICATED STRUCTURES WITH ELECTRICAL ISOLATION AND INTERCONNECTIONS

(75) Inventors: William A. Clark, Fremont; Thor N. Juneau, Berkeley; Allen W. Roessig, Albany; Mark A. Lemkin, Berkeley, all of CA (US)

(73) Assignee: Analog Devices IMI, Inc., Berkeley, CA (US)

( * ) Notice: Subject to any disclaimer, the term of this patent is extended or adjusted under 35 U.S.C. 154(b) by 0 days.

(21) Appl. No.: 09/322,381

(22) Filed: May 28, 1999

Related U.S. Application Data
(60) Provisional application No. 60/090,519, filed on Jun. 24, 1998.

(51) Int. Cl.[7] .................................................. H01L 29/06
(52) U.S. Cl. ............................................ 257/622; 257/499
(58) Field of Search .................................... 257/622, 623, 257/624, 625, 626, 499, 501, 504, 506

(56) References Cited

U.S. PATENT DOCUMENTS

| 5,084,408 | 1/1992 | Baba et al. .............................. 437/62 |
| 5,198,390 | 3/1993 | MacDonald et al. . | |

(List continued on next page.)

OTHER PUBLICATIONS

U.S. application No. 08/874,568, Brosnihan et al., filed Jun. 13, 1997.
Brosnihan, T. et al., "Enbedded Interconnect and Electrical Isolation for High–Aspect–Ratio, SOI Inertial Instruments", *Proc. 1997 International Conference on Solid–State Sensors and Actuators*, Chicago, IL, pp. 637–640, Jun. 16–19, 1997.
Sridhar, U. et al., "Isolation Process for Surface Micromachined Sensors and Actuators," *iMEMS '97 International MEMS Workshop*, National University of Singapore, Singapore, Dec., 1997.
Keller, Christopher, Microfabricated Silicon High Aspect Ratio Flexures for In–Plane Motion, Doctoral Dissertation University of California, 1998.

*Primary Examiner*—Sheila V. Clark
(74) *Attorney, Agent, or Firm*—Vierra Magen Marcus Harmon & DeNiro LLP

(57) ABSTRACT

The invention is directed to a microfabricated device. The device includes a substrate that is etched to define mechanical structures at least some of which are anchored laterally to the remainder of the substrate. Electrical isolation at points where mechanical structures are attached to the substrate is provided by filled isolation trenches. Filled trenches may also be used to electrically isolate structure elements from each other at points where mechanical attachment of structure elements is desired.

The performance of microelectromechanical devices is improved by 1) having a high-aspect-ratio between vertical and lateral dimensions of the mechanical elements, 2) integrating electronics on the same substrate as the mechanical elements, 3) good electrical isolation among mechanical elements and circuits except where electrical interconnection is desired.

17 Claims, 8 Drawing Sheets

U.S. PATENT DOCUMENTS

| | | |
|---|---|---|
| 5,326,726 | 7/1994 | Tsang et al. . |
| 5,343,064 | 8/1994 | Spangler et al. . |
| 5,445,988 | 8/1995 | Schwalke et al. .............. 437/67 |
| 5,447,067 | 9/1995 | Biebl et al. ................ 73/514.32 |
| 5,495,761 | 3/1996 | Diem et al. . |
| 5,504,026 | 4/1996 | Kung ................................ 437/51 |
| 5,506,175 | 4/1996 | Zhang et al. .................. 437/228 |
| 5,569,852 | 10/1996 | Marek et al. . |
| 5,574,222 | 11/1996 | Offenberg . |
| 5,576,250 | 11/1996 | Diem et al. . |
| 5,578,755 | 11/1996 | Offenberg . |
| 5,592,015 | 1/1997 | Iida et al. ...................... 257/524 |
| 5,616,523 | 4/1997 | Benz et al. . |
| 5,627,317 | 5/1997 | Offenberg et al. . |
| 5,627,318 | 5/1997 | Fujii et al. . |
| 5,631,422 | 5/1997 | Sulzberger et al. . |
| 5,719,073 | 2/1998 | Shaw et al. .................... 437/228 |
| 5,723,353 | 3/1998 | Muenzel et al. . |
| 5,747,353 | 5/1998 | Bashir et al. . |
| 5,747,867 | 5/1998 | Oppermann .................... 257/507 |
| 5,756,901 | 5/1998 | Kurle et al. . |
| 5,798,283 | 8/1998 | Montague et al. . |
| 5,847,280 | 12/1998 | Sherman et al. . |
| 5,847,454 | 12/1998 | Shaw et al. .................... 257/734 |
| 5,882,532 | 3/1999 | Field et al. . |
| 5,959,208 | 9/1999 | Muenzel et al. . |
| 6,067,858 * | 5/2000 | Clark et al. . |
| 6,180,536 * | 6/2001 | Chong et al. . |
| 6,199,874 * | 3/2001 | Galvin et al. . |

\* cited by examiner

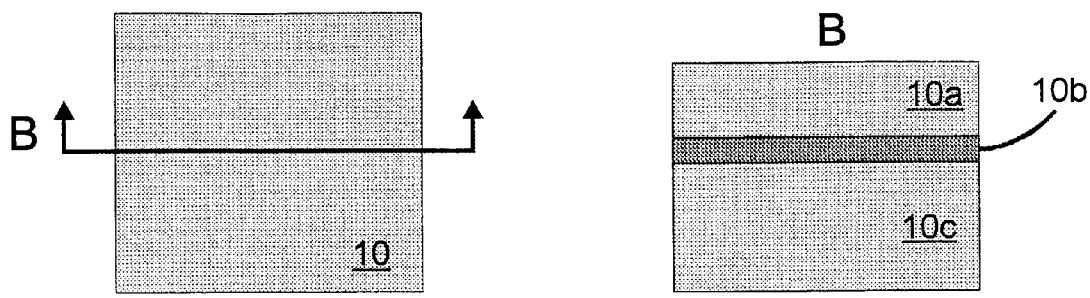
Figure 1 (a) Left, (b) Right
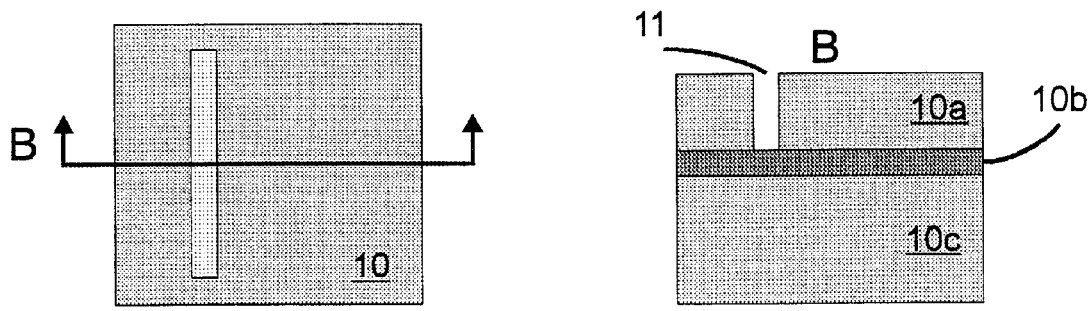
Figure 2 (a) Left, (b) Right
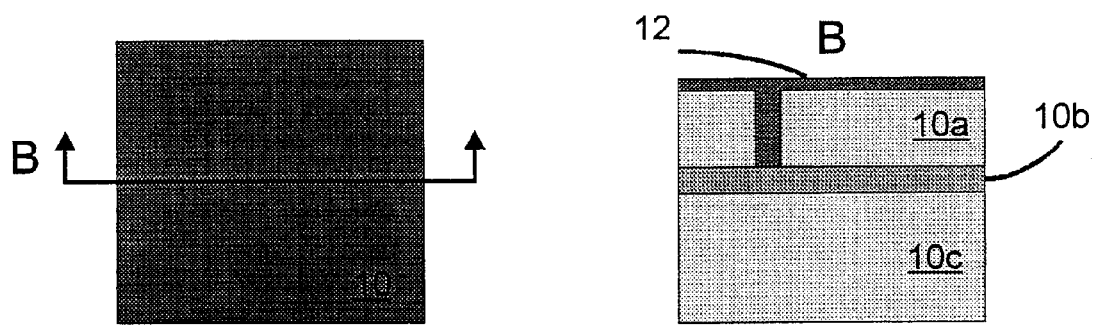
Figure 3 (a) Left, (b) Right
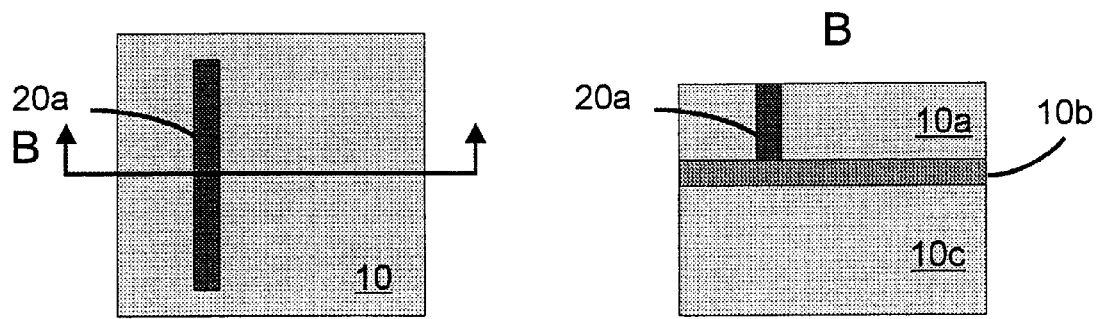
Figure 4 (a) Left, (b) Right

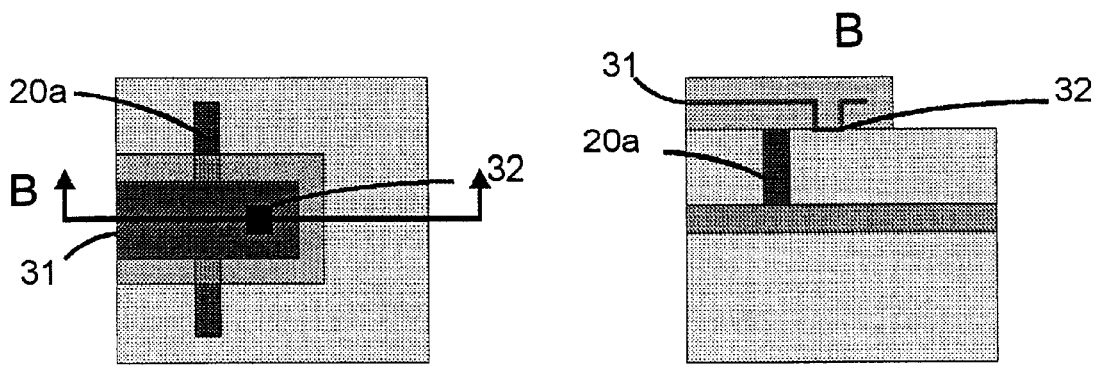
Figure 5 (a) Left, (b) Right
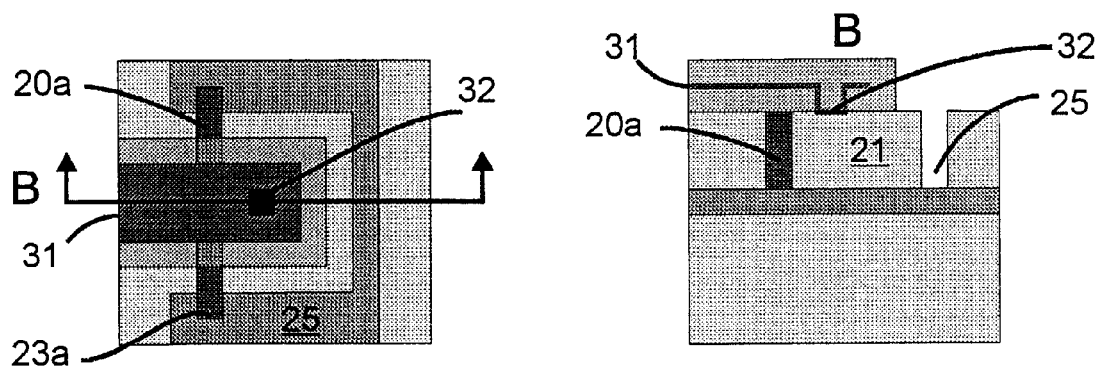
Figure 6 (a) Left, (b) Right
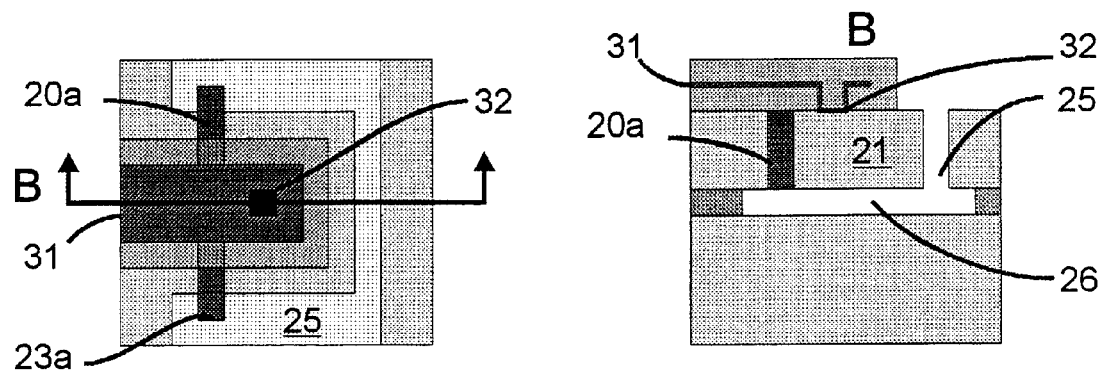
Figure 7 (a) Left, (b) Right

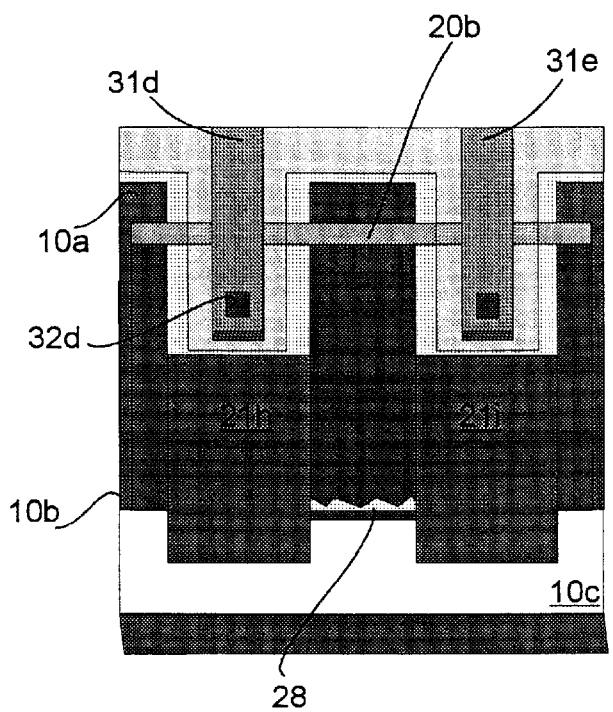
Figure 10
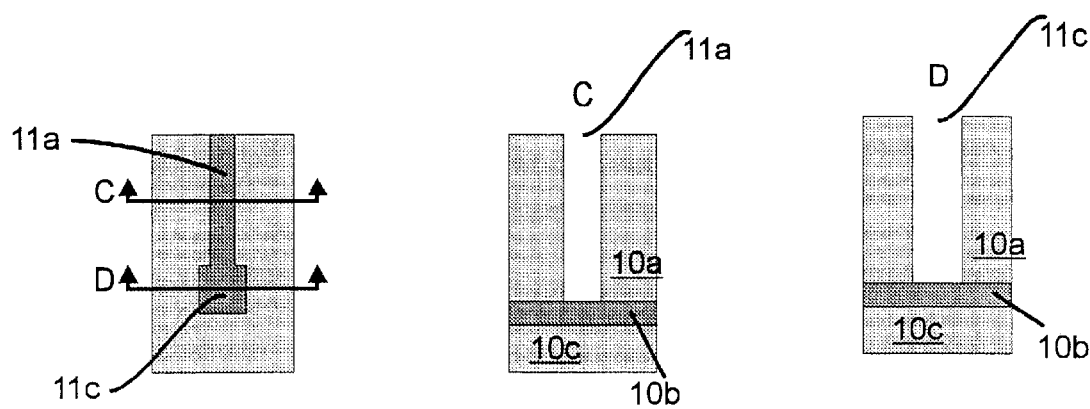
Figure 11 (a) Left, (b) Middle, (c) Right
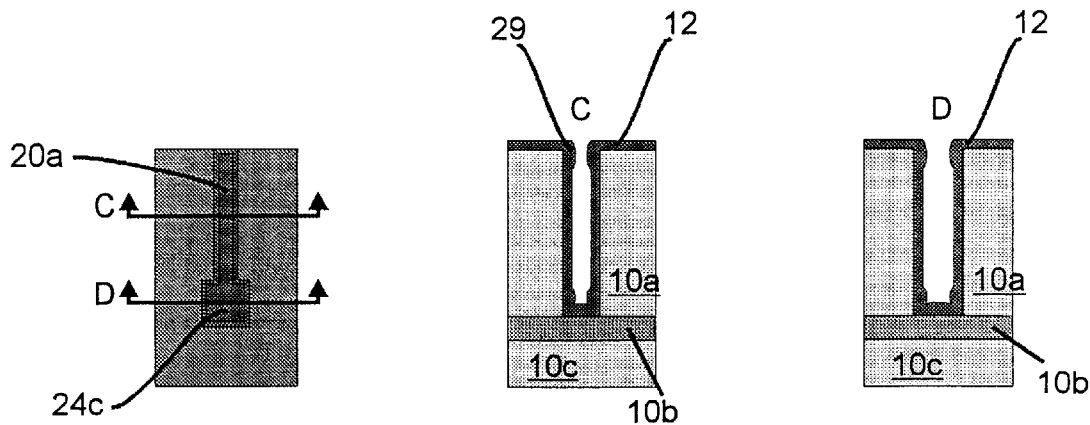
Figure 12 (a) Left, (b) Middle, (c) Right

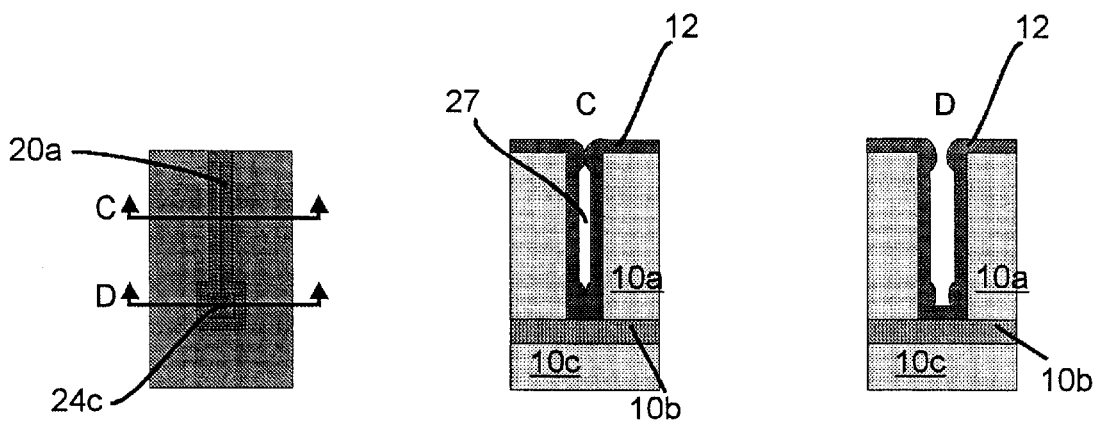
Figure 13 (a) Left, (b) Middle, (c) Right
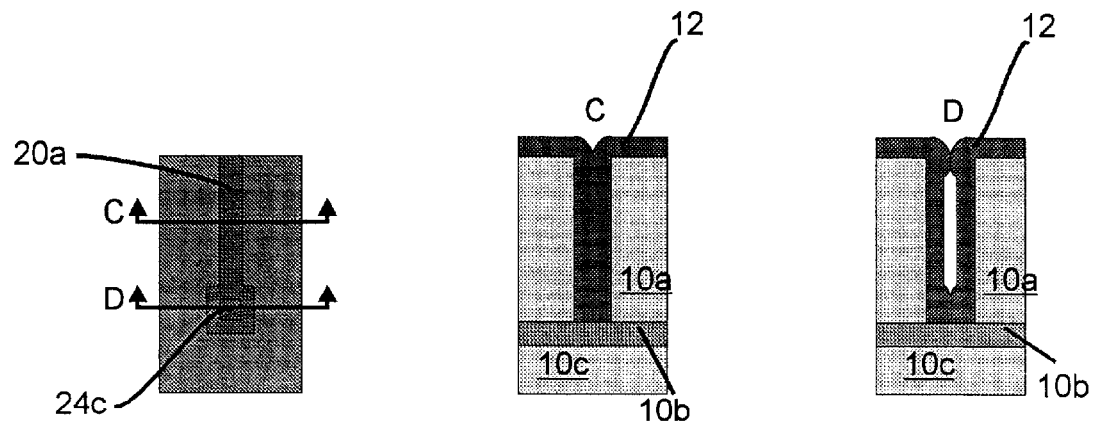
Figure 14 (a) Left, (b) Middle, (c) Right
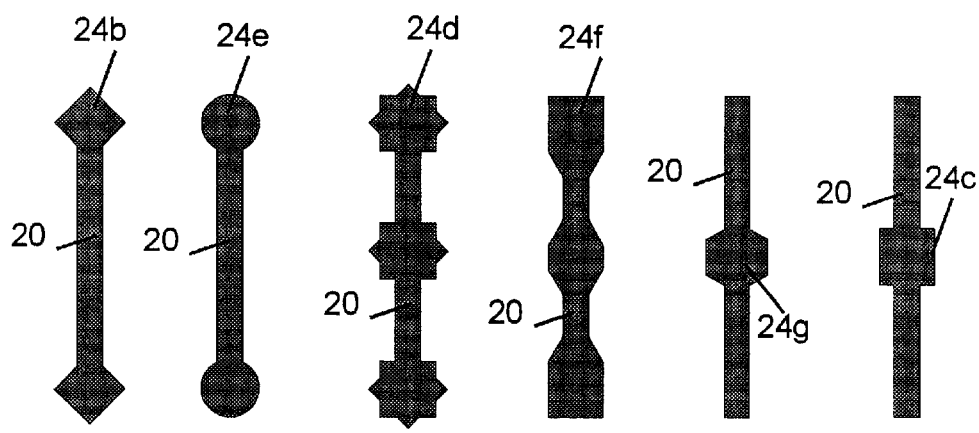
Figure 15 (a) Left through (f) Right

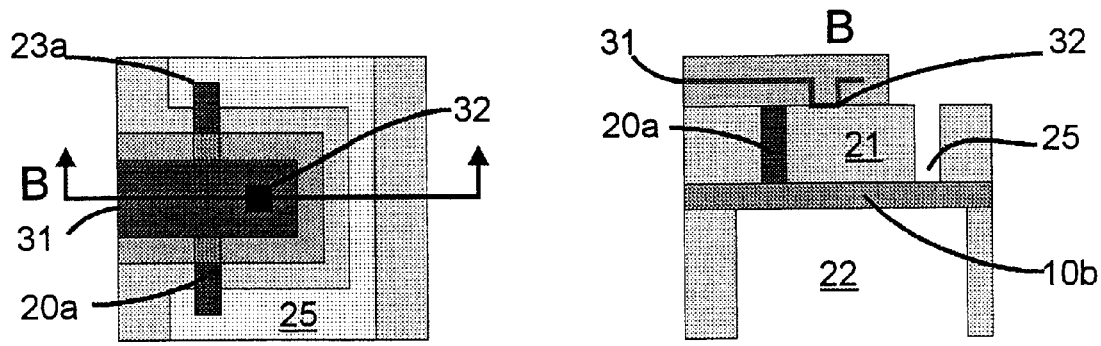
Figure 20 (a) Left, (b) Right
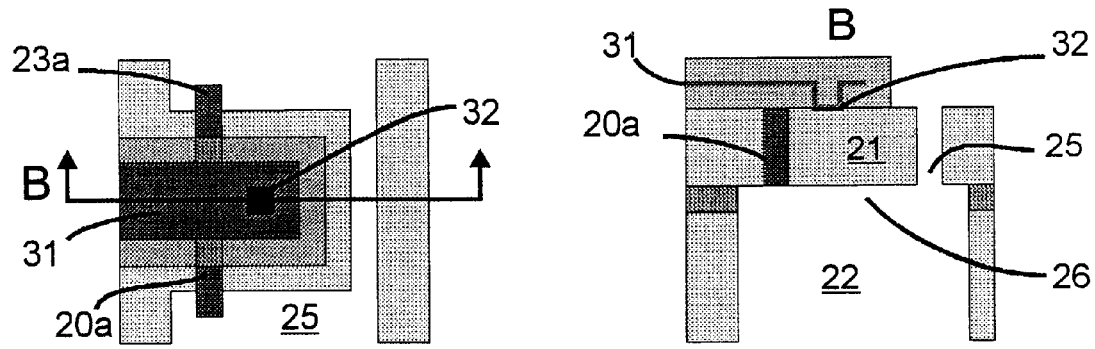
Figure 21 (a) Left, (b) Right

MICROFABRICATED STRUCTURES WITH ELECTRICAL ISOLATION AND INTERCONNECTIONS

PRIOR APPLICATION DATA

This application claims the benefit of U.S. Provisional Application No. 60/090,519 filed Jun. 24, 1998.

IDENTIFICATION OF GOVERNMENT INTEREST

This invention was made with Government support under NAS5-97227 and DMI 97-60647 awarded by the National Aeronautics and Space Administration (NASA) and the National Science Foundation, respectively. The Government has certain rights in the invention.

FIELD OF THE INVENTION

This invention relates generally to microfabricated devices, and more particularly to three-dimensional devices fabricated with high vertical to horizontal aspect ratios. This invention results in high-aspect-ratio devices that may be fabricated with integrated circuitry on the same substrate using conventional microfabrication techniques.

BACKGROUND OF THE INVENTION

MicroElectroMechanical Systems (MEMS) combine mechanical structures and microelectronic circuits to create integrated devices. MEMS have many useful applications such as microsensors and microactuators. Examples of microsensors include inertial instruments such as accelerometers and gyroscopes, detectors for gasses such as carbon-monoxide, and pressure sensors. Examples of microactuators include optical mirrors used for video displays, switching arrays, and disk-drive head actuators used for increasing track density.

Many MEMS-based devices utilize electrical circuits combined with air-gap capacitors to sense motion, or to apply electrostatic forces to a movable structure. Air-gap capacitors are often formed between sets of capacitor plates anchored to a substrate interleaved with plates attached to a movable structure. The performance of many capacitive-based MEMS improves as: 1) the overlap area of capacitor plates increases, 2) the distance between the stationary and movable capacitor plates decreases, 3) the compliance of the structure varies dramatically in different directions, and 4) the mass of the structure increases. Each of these performance issues is enhanced using high-aspect-ratio semiconductor technologies, wherein thickness or depth of fabricated structures is much larger than small lateral dimensions such as width of flexible beams and gaps between capacitor plates.

Electrical interfaces for capacitive-based MEMS require electrically isolated nodes spanned by one or more variable capacitors such as an air-gap capacitor. Thus, capacitive interfaces using capacitors formed between structural elements require electrical isolation between these structural elements.

The performance of devices such as accelerometers and gyroscopes may benefit from combining high-aspect-ratio structures with circuits integrated in the same substrate. Hence, a high-aspect-ratio structure etched into a single-crystal silicon substrate that also contains integrated circuits is of particular interest. Of even greater interest is a process sequence that yields structures and circuits in the same substrate but does not significantly alter complex and expensive circuit fabrication processes. Such a process sequence enables cost-effective manufacture of devices comprising integrated circuits and structures on a single substrate.

For improved performance, an integrated MEMS process should address three issues. First, the structural elements should be formed by a high-aspect-ratio process. Second, fabrication of mechanical structures should have a minimal impact on fabrication of associated circuitry on the same substrate. Third, structural elements should be electrically isolated from one another, the substrate, and circuit elements except where interconnection is desired.

SUMMARY OF THE INVENTION

In one aspect, the invention is directed to a microfabricated device. The device includes a substrate that is etched to define mechanical structures that are anchored laterally to the remainder of the substrate. Electrical isolation where mechanical structures are attached to the substrate is provided by trenches etched in the substrate that are subsequently lined with an insulating material.

Circuit elements may be formed in the substrate material. Conducting material deposited over isolating trenches may be used to interconnect electrically isolated circuit and structural elements. The insulating lining deposited in the trenches may fill the trenches or the lining may be filled with a second material that is not necessarily insulating. The substrate may also include a device layer in which one or more structures and electrical circuits are formed, a handle layer, and a sacrificial layer between the device and handle layers. A portion of the sacrificial layer may be removed to free the structures from the substrate. The sacrificial layer may include silicon dioxide, the substrate or device layer may include single-crystal or epitaxial silicon, the isolation material may include a silicon nitride, and the trench fill material may include polycrystalline silicon.

Performance of devices fabricated in accordance with the invention is improved due to the proximity of interface circuitry built into the same substrate as the microstructures. Performance of microstructures is improved due to the high-aspect-ratio fabrication that yields larger mass, air-gap capacitors with larger sensitivity, and improved suppression of undesired deflections-particularly deflections out of the plane of the substrate. The invention is compatible with existing microfabrication techniques and is compatible with established integrated circuit fabrication processes.

BRIEF DESCRIPTION OF THE DRAWINGS

For a better understanding of the nature and objects of the invention, reference should be made to the following detailed description taken in conjunction with the accompanying drawings, in which:

FIG. 1a is a plan-view and FIG. 1b is a cross-sectional view of the starting material and the region of the substrate in which trenches will be formed.

FIG. 2a is a plan-view and FIG. 2b is a cross-sectional view of a trench after the first deep-RIE etch.

FIG. 3a is a plan-view and FIG. 3b is a cross-sectional view of a trench after the first trench is filled.

FIG. 4a is a plan-view and FIG. 4b is a cross-sectional view of a trench after trench-fill material is removed from the surface of the wafer.

FIG. 5a is a plan-view and FIG. 5b is a cross-sectional view of a trench after fabrication of integrated electronics.

FIG. 6a is a plan-view and FIG. 6b is a cross-sectional view of a trench and a simple mechanical structure defined by the second deep-etch.

FIG. 7a is a plan-view and FIG. 7b is a cross-sectional view of a trench and a simple mechanical structure after removal of sacrificial material.

FIG. 10 is a perspective cut-away view of one region in which stringers may form.

FIG. 11a is a plan-view and FIG. 11b,c are cross-sectional views of a trench with a condyle.

FIG. 12a is a plan-view and FIG. 12b,c are cross-sectional views of a trench with a condyle during deposition of insulating material and before pinching-off of the trench occurs.

FIG. 13a is a plan-view and FIG. 13b,c are cross-sectional views of a trench with a condyle during deposition of insulating material after pinching-off of the trench, but before pinching-off of the condyle occurs.

FIG. 14a is a plan-view and FIG. 14b,c are cross-sectional views of a trench with a condyle after deposition of insulating material and after pinching-off of both the trench and the condyle.

FIG. 15a–f is a series of plan views of trenches terminated with different-shaped condyles.

FIG. 20a is a plan-view and FIG. 20b is a cross-sectional view of a trench and a simple mechanical structure after removal of a region of the handle-wafer underneath the region of the mechanical structure.

FIG. 21a is a plan-view and FIG. 21b is a cross-sectional view of a trench and a simple mechanical structure after removal of sacrificial material.

DETAILED DESCRIPTION OF THE INVENTION

Figure 8:
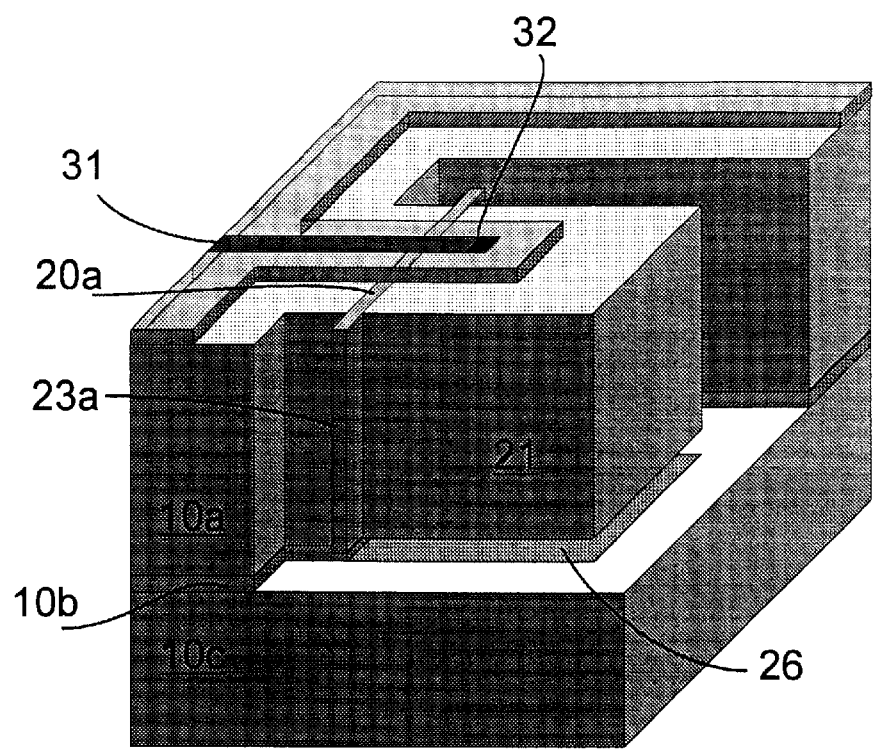
FIG. 8 is a perspective cut-away view of the released mechanical structure shown in FIG. 7.

Fabrication of devices in accordance with the present invention, as illustrated in FIG. 8, comprises three basic steps: formation of a set of insulating trenches 20a–c, formation of interconnection 31 and 32, and the formation of structures 21. FIG. 1 through FIG. 7 illustrate these fabrication steps.

Referring to FIG. 1, the starting material 10 may comprise, in one embodiment, a bonded wafer structure having a number of layers including: a handle wafer 10c, a sacrificial material 10b, and a conductive device layer 10a. While different materials may be used, the handle wafer may be single-crystal silicon, quartz, or glass; the sacrificial layer may be silicon dioxide; and the device layer may be single-crystal silicon. Alternatively, the device layer may be single-crystal silicon with a surface coating of epitaxial single-crystal silicon tailored for the fabrication of integrated circuitry. When the device layer contains an epitaxial silicon layer, dopants may be selectively introduced (through implantation or diffusion, for example) into regions of the epitaxial layer to enhance conduction from the surface of the device layer to the silicon on which the epitaxy is deposited. In addition, a material such as silicon dioxide may be deposited or grown over the surface of the device layer to protect the device layer from damage during trench formation and filling.

A first trench etch cuts through the device layer at least as deep as the sacrificial material 10b. As shown in FIG. 2, the first trench etch results in trench 11 and may be performed using a reactive-ion etch (RIE), for example. Trench 11 is then lined with an insulating material 12, such as Low-Pressure Chemical-Vapor Deposition (LPCVD) silicon nitride, shown in FIG. 3. The insulating material 12 may be used to completely fill the trench 11 or additional filler materials, such as silicon dioxide or polysilicon, may be used to complete the fill of trench 11. Referring to FIG. 4, once the trench 11 has been filled, the trench fill material 12 is removed from the surface of the wafer to reveal the surface of the substrate 10a. Removal of trench-fill material 12 from the wafer surface may be achieved using dry- or wet-etching, grinding, or chemical-mechanical polishing, for example. This completes the formation of the filled insulation trenches 20. Note that a mechanical device may have a plurality of insulation trenches 20, as described below.

Referring to FIG. 5, the formation of circuit elements follows the formation of the insulation trenches 20. Circuit formation may be accomplished using any number of well known semiconductor circuit fabrication processes, such as CMOS, that will result in electronic circuit elements, such as transistors, and electrical interconnection among circuit elements. In addition, circuit formation may result in one or more conductors 31 that connect to the substrate material by contacts 32. The conductors 31 and contacts 32 may permit electrical connection among structures 21 and electrical circuits 30. Electrical circuits may be used for measurement of capacitance (often called sense-capacitance) between isolated mechanical structures to yield a quantity representative of distance between the mechanical structures, for example. Electrical circuits may also be used to apply voltages to isolated mechanical structures to generate electrostatic forces. Other uses of electrical circuits include, but are not limited to: calculating or signal processing of quantities based on measurements of sense-capacitance, sustaining oscillation of a mechanical structure, measurement of changes in a piezoresistor which may be formed in the device layer, and measurement of current flow due to electron-tunneling between isolated mechanical structures.

Figure 17:
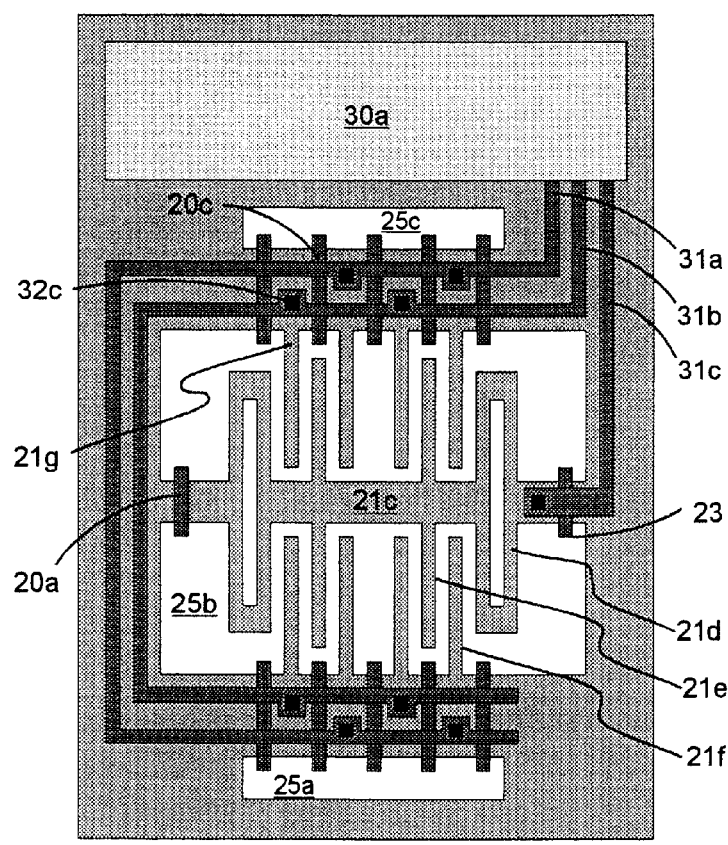
FIG. 17 is a plan view of a substantially planar device with multiple mechanical structures and multiple interconnects integrated with circuitry.

Mechanical structures are defined with a second etch. Referring to FIG. 6, a deep etch, which may be a deep RIE for example, removes excess material 10a to reveal sacrificial material 10b. Removal of excess material 10a leaves open regions 25 which may define mechanical structures such as comb-fingers 21e,f,g, movable proof-masses 21c, or suspensions 21d as shown in FIG. 17, for example. Note that sacrificial material 10b may serve as an etch-stop layer for the second etch. The removal of excess material 10a not only defines mechanical structures but also provides a majority of required electrical isolation between separate mechanical structures. Additional isolation is provided by isolation trenches 20 and by removal of sacrificial material 10b as shown in FIG. 7. Sacrificial material 10b may be removed with a wet-release process. When the sacrificial material 10b is silicon dioxide any of a number of well known etching chemistries, including hydrofluoric acid, may be used to remove sacrificial material under structures 21 as well as remove sacrificial material exposed by open regions 25. In addition to providing increased electrical isolation, removing sacrificial material under structures 21 leaves open areas 26, mechanically freeing structures from the handle wafer. A perspective view of a very simple microfabricated device is shown in FIG. 8.

Figure 9:
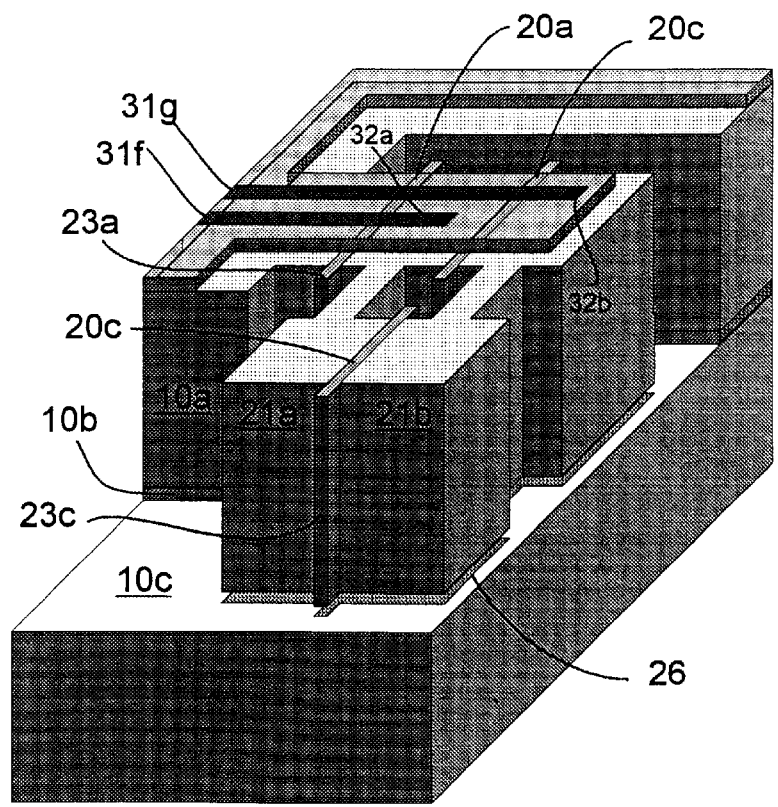
FIG. 9 is a perspective cut-away view of a device that has multiple electrically isolated nodes on a single mechanical structural element.

The process described above also provides for fabrication of structural elements that comprise multiple electrical nodes. FIG. 9 shows an example of a single structural element that contains multiple electrical nodes. In a unique feature of the present invention, two nodes may be electrically isolated from one another by refilled trenches 20c. The structure is electrically isolated from and mechanically anchored to the substrate by refilled trench 20a. Note refilled trenches 20c are not mechanically attached to the underlying substrate due to the nature of the process sequence, thereby enabling movement of released mechanical structures with respect to the substrate.

Because of restrictions of processing technology, including RIE, a potential exists for electrical conduction between mechanical structures intended to be isolated. One method by which electrical conduction may occur is through conductive "stringers" 28 located along the wall of the trench. A stringer is defined as undesirable material left behind after etching. An example of a stringer is shown in FIG. 10. To prevent stringer formation, a single trench should not intersect multiple electrically isolated structures, as shown in FIG. 10. In addition, trenches should extend into a region 25 cleared during the second deep etch at each point where isolation is desired. A protrusion of a trench into a region 25 is termed a "nubbin" 23. By ensuring that every isolation trench 20 terminates in a region 25 cleared during the second deep etch (i.e. every trench ends with a nubbin), three faces of the trench are exposed to the second deep etch. Increased exposure to the second etch reduces incidence of stringers and results in the improved isolation characteristics of the device. Furthermore, trench fill materials attacked by the second deep etch may be selected, resulting in etching of the nubbins 23. Etching nubbins 23 to the sacrificial material 10b ensures electrical isolation across the trench.

Because trenches 11 typically have a large height-to-width aspect-ratio, trenches may have keyholes 27 after filling, shown in FIG. 13. A keyhole is produced when the trench-fill material 12 plugs the top of a trench 11 before enough material may be deposited to completely fill the center region of the trench. Keyhole formation is undesirable because keyholes may significantly reduce the mechanical strength and reliability of the trench. When the trench-fill deposition is substantially isotropic (such as LPCVD silicon nitride) keyhole formation may be reduced using condyles 24, which are areas along the length of the trench with an increased trench width. Condyles reduce keyholing by enabling deposition material to travel down and laterally into the keyhole. FIG. 11 shows a plan and cross-sectional view of a trench and condyle before insulating material 12 is deposited. FIG. 12 shows the formation of lips 29 at the top of the trench which eventually pinch-off as shown in FIG. 13. Once the lips pinch-off further deposition of material inside the trench from the top is prevented. Since the cross-sectional area of the condyle is greater than the cross sectional area of the trench the condyle enables further deposition of material by lateral migration until the lips at the top of the condyle pinch-off, shown in FIG. 14. Examples of condyles 24 attached to trenches 20 are shown in FIG. 15. To prevent keyholes along the length of a trench, small regions of a trench may be chosen to have an increased width. Note that condyles may be formed at one or both ends of a trench, along the length of a trench including one or more ends, or along the length of a trench not including the ends, as illustrated in FIG. 15. Condyle shapes are not limited to the examples shown in FIG. 15; many shapes with an effective cross-sectional width greater than the nominal trench width may serve as a condyle.

Figure 16:
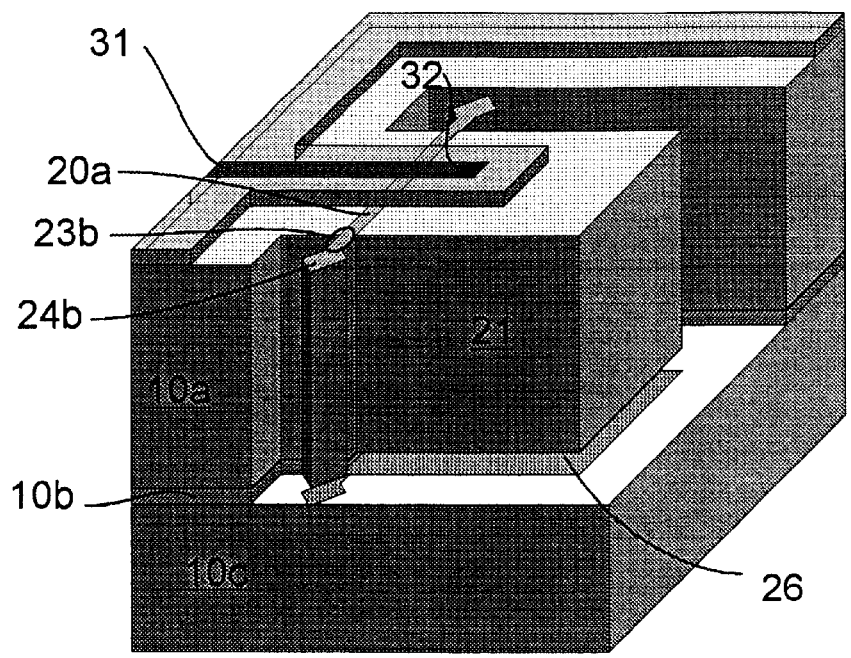
FIG. 16 is a perspective cut-away view of the released mechanical structure shown in FIG. 7 with a diamond-shaped condyle.

In a further aspect of the invention, condyles may be placed at the end of nubbins 23. A perspective cut-away view of an isolation trench with a nubbin and a condyle is shown in FIG. 16. Alternatively, condyles may serve two functions: reduce keyholing while simultaneously serving as a nubbin. To serve these two functions, the boundary of the region removed during the second etch should stop along the length of the condyle such that at least part of the condyle protrudes into region 25.

As an example of a device fabricated in accordance with the present invention, FIG. 17 illustrates an accelerometer that measures translational acceleration. However, the principles of the invention are applicable to many other devices including, but not limited to gyroscopes, angular accelerometers, mechanical valves, and disk-drive head actuators.

An embodiment of an accelerometer comprises a proof-mass 21c, stationary interdigitated comb fingers 21f,g electronic circuitry 30a, and electrical interconnect 31a,b,c. The proof-mass 21c is able to move relative to the substrate since sacrificial material underneath the proof-mass has been removed. The proof-mass includes a flexure 21d that allows the proof-mass 21c to deflect, and comb-fingers 21e that are interleaved with stationary comb-fingers 21f,g. Proof-mass comb-fingers 21e form air-gap capacitors with stationary comb-fingers 21f,g. Deflections of the proof-mass from translational accelerations along the input axis result in an imbalance in the air-gap capacitors. Electronic circuitry 30a may measure this imbalance to determine acceleration. Furthermore, electronic circuitry 30a may force-balance the proof-mass using electrostatic attraction between comb-fingers 21e and 21f,g or a separate set of comb-fingers.

The illustrated accelerometer built in substrate 10 includes the following: circuitry 30a, interconnection 31a, b,c and 32c, as well as movable proof-mass 21c. Mechanical elements such as the accelerometer proof-mass and the stationary, interdigitated comb fingers 21f,g were formed during the second deep etch. The second deep etch removes substrate material thereby defining structural elements 21c, d,e and 21f,g. Many of the mechanical elements such as the proof-mass 21c and the interdigitated comb-fingers 21f,g are electrically isolated from the handle wafer by the removal of sacrificial material. Many of the mechanical elements such as the proof-mass 21c and the stationary, interdigitated comb-fingers 21f,g are electrically isolated from each other, the circuitry, and the remainder of the substrate by a combination of regions 25 formed during the second deep etch, and a set of filled isolation trenches 20a,c with nubbins 23. Optional condyles may be added for improved trench filling. Electrical connection between the mechanical structures 21 and the associated circuitry 30a is made using interconnection 31a,b,c and contacts 32c. The interconnection 31a,b,c is formed from a conducting material that makes electrical connection to mechanical and electrical elements via contacts 32c. Accelerometer performance is enhanced over prior-art implementations due to improved isolation provided by nubbins and increased mechanical strength of filled isolation trenches provided by condyles. When the interconnection material is metal a low-noise sensor may be produced since metal interconnect typically has a small sheet resistance.

Figure 18:
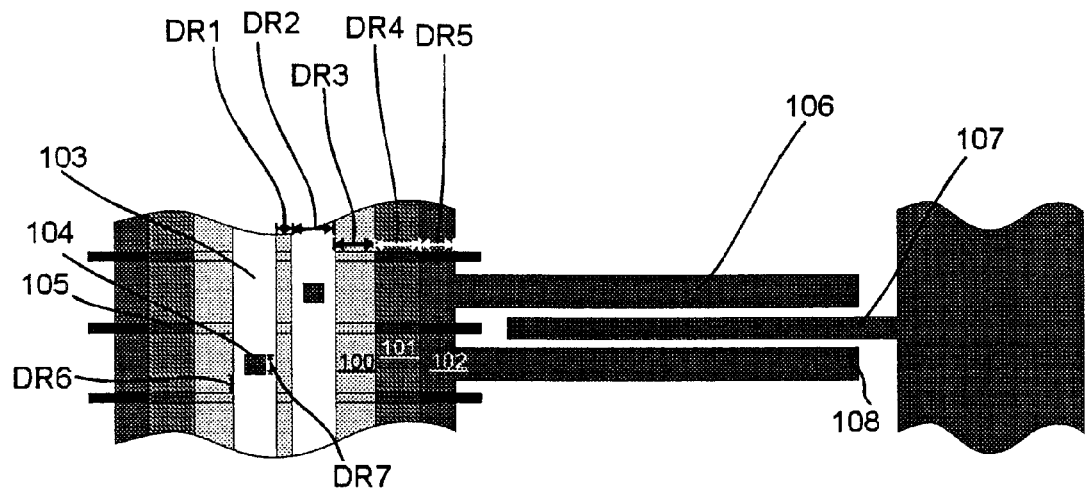
FIG. 18 is a plan view of a substantially planar device with multiple mechanical structures, nubbins, and geometric design rules.
Figure 19:
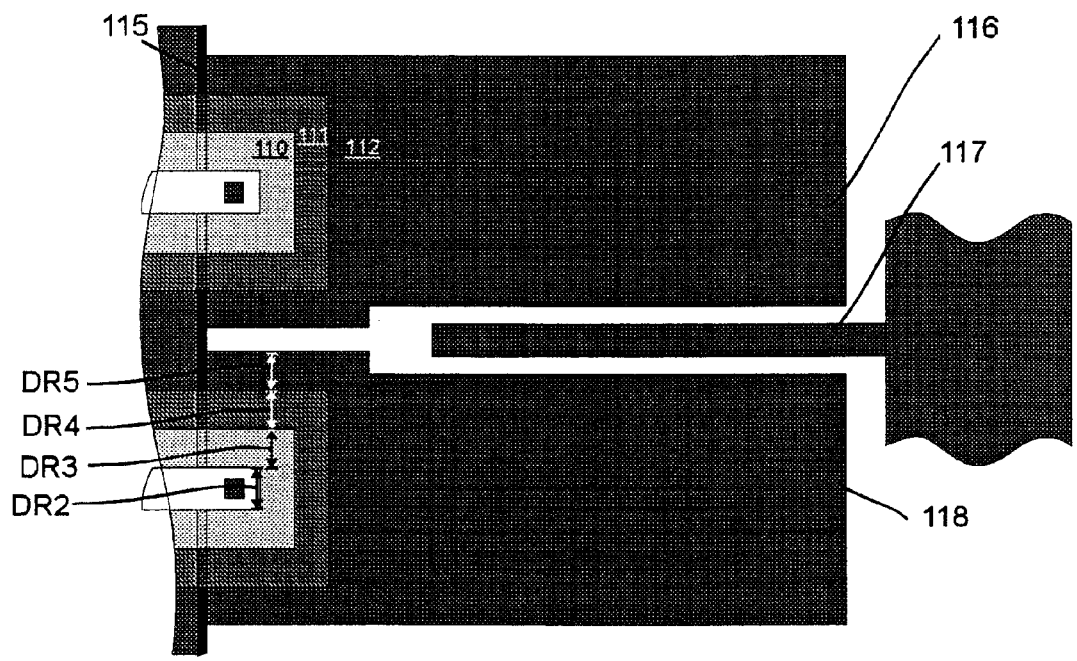
FIG. 19 is a plan view of a substantially planar device with multiple mechanical structures, without nubbins, and with geometric design rules.

FIG. 18, taken in conjunction with FIG. 19 shows yet another aspect of the invention. When circuits are integrated on the same substrate as a mechanical structure a set of geometric design rules typically specify minimum distances between the separation and/or overlap of certain layers with respect to each other. For example, when a typical CMOS process flow is integrated on the same substrate as a mechanical structure, a substrate contact may be used to attain connectivity from the circuits to the structure. In many cases, certain layers must be terminated in a specific order with specific critical dimensions for reasons that may include photolithographic, topological, or mask-alignment constraints. For illustrative purposes, if the process flow results in the deposition and patterning of a passivation layer 101, 111 on top of a layer of patterned metal 103, which is supported above the substrate by one or more dielectric layers 100, 110 a set of design rules may include DR1: metal to metal spacing of at least 2 microns, DR2: minimum metal width of at least 2 microns, DR3: minimum distance between metal and edge of dielectric of at least 3 microns, DR4: minimum distance between dielectric and edge of passivation of at least 3 microns, DR5: minimum distance between passivation and any structure formed by the second etch of at least 3 microns, DR6: minimum separation between contact and trench of at least 2 microns, DR7: contact width exactly 1 micron. For this illustrative example the minimum pitch for the fingers 106, 108 using the nubbin design of FIG. 18 is set by (2*DR6)+DR7, which equals 5 microns. FIG. 19 shows a layout of a similar structure that doesn't use nubbins. For similar design rules the minimum pitch between structures is given by 2*(DR3+DR4+DR5)+DR2 equaling 20 microns. The reduced pitch of the nubbin structure enables more active structural elements to be included in a given space than the method of FIG. 19 allows. Inclusion of more active structural elements can be used for attaining a more sensitive sensor, for example.

In an alternate embodiment of the invention, a dry-etch process may be used to remove the sacrificial layer 10b beneath the structure 21. Referring to FIG. 6 and FIG. 20, a region 22 of the handle wafer 10c, beneath a region under the structure 21, may first be etched to expose sacrificial material 10b. Etch of the handle wafer may be anisotropic, using wet-etch processes such as KOH, TMAH, or EDP or dry-etch processes such as reactive ion etch. Furthermore, the crystal orientation of the handle wafer may be <111>, which will result in vertical sidewall etches in KOH, TMAH, or EDP. The handle wafer may also be isotropically etched using wet processes. Referring to FIG. 21, once sacrificial material 10b is exposed, a dry-etch process (such as a plasma-based process) may be used to remove sacrificial material. Note that a dry-etch of sacrificial material 10b to leave open areas 26 does not expose mechanical structures to potentially harmful wet processes. Furthermore, this method allows the trench-refill material 12 to be susceptible to etchants that attack the sacrificial material 10b, such as a deposited silicon dioxide when the sacrificial material is silicon dioxide.

In yet another embodiment of the invention, the substrate material 10a is doped single-crystal silicon and the trench-fill material 12 is doped polycrystalline silicon. The doping of the substrate and the trench-fill materials is selected such that a P-N semiconductor junction is created between the fill material and the substrate. For example, if the substrate has N-type dopant such as arsenic, the polycrystalline silicon would be doped with a P-type dopant such as boron. Due to diffusion of the polycrystalline silicon dopant into the substrate material 10a, the P-N junction will typically occur in the substrate material. Electrical isolation may be provided with a reverse bias on the P-N junction formed between the trench 20 and the substrate 10a. An advantage of this method is that the second deep etch attacks the trench material 20 at a rate similar to the substrate material 10a. Consequently, nubbins 23 are substantially removed, reducing stringers. Thus, electrical isolation of the structural elements 21 is ensured.

The foregoing description, for the purposes of explanation, used specific nomenclature to provide a thorough understanding of the invention. However, it will be apparent to one skilled in the art that the specific details are not required in order to practice the invention. Thus, the foregoing descriptions of specific embodiments of the invention are presented for the purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A microelectromechanical device, comprising:

a substrate having a semiconductor device layer;

a first trench formed in said device layer, said first trench including a dielectric;

a second trench formed in said device layer, said second trench simultaneously defining one or more planar microstructures and providing electrical isolation between said one or more planar microstructures and at least a portion of said device layer;

wherein said first trench extends through said device layer and has a first end and a second end, each end terminating in said second trench.

2. The device of claim 1 wherein said second trench provides additional isolation between two or more adjacent microstructures.

3. The device of claim 1 wherein said first trench includes a condyle.

4. The device of claim 1 wherein said first trench is substantially filled with said dielectric.

5. The device of claim 1 wherein said substrate further includes a handle layer and a sacrificial layer.

6. The device of claim 5 wherein said first trench and said second trench extend from an exposed surface of said device layer towards said handle layer.

7. The device of claim 5 wherein regions of said sacrificial layer are removed, thereby forming a gap between said handle wafer and at least a portion of said microstructure.

8. The device of claim 5 wherein said sacrificial layer includes silicon dioxide.

9. The device of claim 1 wherein said dielectric comprises a material chosen from at least one of: silicon nitride, polysilicon.

10. The device of claim 1 wherein said first trench further includes polysilicon.

11. The device of claim 1 wherein said device layer includes single-crystal silicon.

12. The device of claim 1 further including an electrical connection over said first trench, terminating with a conductive contact to at least one of said one or more planar microstructures.

13. The device of claim 12 further including circuitry formed in said device layer, said circuitry including at least one transistor.

14. The device of claim 1 further including a nubbin.

15. The device of claim 1 wherein said first trench electrically isolates two regions of at least one of said one or more planar microstructures.

16. A microelectromechanical device, comprising:

a substrate having a semiconductor device layer;

a trench formed in said device layer, said trench including a dielectric, said trench having a first extent and a second extent;

wherein said first extent terminates in a nubbin, and said second extent terminates in a nubbin.

17. A microelectromechanical device, comprising:

a substrate having a semiconductor device layer;

one or more first trenches formed in said device layer, said one or more first trenches including a dielectric, each said one or more first trenches having a first extent and a second extent;

a plurality of second trenches in said device layer, said second trenches defining one or more planar microstructures;

wherein said first extent and said second extent each terminate in a second trench, thereby providing a defined area absent of conductive material around each of said first extent and said second extent.

* * * * *